(12) United States Patent
Jeon et al.

(10) Patent No.: US 7,738,309 B2
(45) Date of Patent: Jun. 15, 2010

(54) SEMICONDUCTOR MEMORY DEVICE HAVING FUSE CIRCUITS AND METHOD OF CONTROLLING THE SAME

(75) Inventors: Hong-Soo Jeon, Suwon-si (KR); Dae-Han Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 365 days.

(21) Appl. No.: 11/946,359

(22) Filed: Nov. 28, 2007

(65) Prior Publication Data

US 2008/0158977 A1   Jul. 3, 2008

(30) Foreign Application Priority Data

Dec. 27, 2006   (KR) .................. 10-2006-0135049

(51) Int. Cl.
    *G11C 17/18* (2006.01)
(52) U.S. Cl. .............................. 365/225.7; 365/185.33; 365/191; 365/189.04; 365/189.09
(58) Field of Classification Search .............. 365/225.7, 365/185.33, 191, 189.04, 189.09
See application file for complete search history.

(56) References Cited

U.S. PATENT DOCUMENTS

| 6,469,884 | B1 | 10/2002 | Carpenter, Jr. et al. |
| 6,882,214 | B2 | 4/2005 | Spenea et al. |
| 7,313,038 | B2 * | 12/2007 | Otsuka ...................... 365/201 |
| 2005/0270714 | A1 | 12/2005 | Huang et al. |
| 2006/0028777 | A1 | 2/2006 | Chung et al. |

* cited by examiner

*Primary Examiner*—Thong Q Le
(74) *Attorney, Agent, or Firm*—Volentine & Whitt, P.L.L.C.

(57) ABSTRACT

A non-volatile semiconductor memory device includes a read voltage generating circuit, a flash cell fuse circuit and a row decoder. The read voltage generating circuit generates a read voltage in response to a read enable signal and a trim code. The flash cell fuse circuit generates the trim code in response to a cell selection signal and a fuse word-line enable signal, the fuse word-line enable signal being activated after the read enable signal by a first delay time. The row decoder decodes the read voltage in response to a row address signal to generate a decoded read voltage, and to provide the decoded read voltage to a memory cell array.

24 Claims, 6 Drawing Sheets

SEMICONDUCTOR MEMORY DEVICE HAVING FUSE CIRCUITS AND METHOD OF CONTROLLING THE SAME

CROSS-REFERENCE TO RELATED APPLICATIONS

A claim of priority is made to Korean Patent Application No. 10-2006-0135049, filed on Dec. 27, 2006, the subject matter of which is hereby incorporated by reference.

BACKGROUND THE INVENTION

1. Field of the Invention

The present invention relates to a semiconductor memory device, and more particularly, to a non-volatile semiconductor memory device capable of preventing fuse cells of a flash cell fuse circuit from being programmed by a static electric charges and a method of controlling the same.

2. Description of the Related Art

Semiconductor memory devices may be classified into volatile semiconductor memory devices and non-volatile semiconductor memory devices. In a volatile semiconductor memory device, data can be stored or erased by changing logic states of a bi-stable flip-flop, or data can be stored or erased by charging/discharging a capacitor. The data is maintained while power is supplied to the volatile semiconductor memory device, and the stored data is erased when the power is off.

In contrast, a non-volatile semiconductor memory device, such as a flash memory device, can preserve the stored data even when the power is off. Thus, the non-volatile semiconductor memory device is used for various devices, such as computers, mobile devices, and the like. The flash memory device is a non-volatile semiconductor memory device widely used as a secondary memory device for systems that need to be updated repeatedly. Generally, the flash memory device includes a flash cell fuse for generating a trim code.

FIG. 1 is a flow chart illustrating an early stage of a read operation in a conventional flash memory device. Referring to FIG. 1, a power-up operation is performed (step S1), a fuse cell voltage is sensed (step S2), a pumping operation of a read voltage is started (step S3), and a read operation is performed (step S4) in the early stage of the read operation.

FIG. 2 is a timing diagram illustrating an early stage of a read operation in a conventional flash memory device. Referring to FIG. 2, an external power supply voltage EVC increases to a power supply voltage VDD in a first time region REG1 where a power-up operation is performed. A power-up signal PUP is generated in the first time region REG1. In response to the power-up signal PUP, a fuse word-line enable signal FUSE_WL is activated, and a delayed power-up signal PUP_D is generated. A read enable signal VREAD_EN is activated in response to a falling edge of the delayed power-up signal PUP_D. A read voltage VREAD is generated in response to the read enable signal VREAD_EN.

Referring to FIG. 1 and FIG. 2, in the conventional flash memory device, the read voltage VREAD is generated after the fuse word-line enable signal FUSE_WL is activated. A voltage between a gate and a source of fuse cells that constitute the flash cell fuse circuit may be increased enough for programming the fuse cells in the first time region REG1 when static electric charges are input into the conventional flash memory device through input/output (I/O) pads. Therefore, it is desirable to have a flash memory device capable of preventing the fuse cells from being programmed by static electric charges.

SUMMARY OF THE INVENTION

According to exemplary embodiments of the present invention, a non-volatile semiconductor memory device includes a read voltage generating circuit, a flash cell fuse circuit and a row decoder. The read voltage generating circuit is lo configured to generate a read voltage in response to a read enable signal and a trim code. The flash cell fuse circuit is configured to generate the trim code in response to a cell selection signal and a fuse word-line enable signal, the fuse word-line enable signal being activated after the read enable signal by a first delay time. The row decoder is configured to decode the read voltage in response to a row address signal to generate a decoded read voltage, and to provide the decoded read voltage to a memory cell array.

The read voltage generating circuit may perform a pumping operation in response to the read enable signal to reduce a voltage difference between a gate and a source of each cell in the flash cell fuse circuit when static electric charges are received through input/output (I/O) pads.

A voltage level of the fuse word-line enable signal may be substantially equal to a power supply voltage level. Also, the read voltage level may be higher than the power supply voltage level.

The read enable signal may be activated in response to a power-up signal, and the fuse word-line enable signal may be activated in response to a delayed power-up signal that is delayed by a second delay time with respect to the power-up signal. The second delay time may be substantially equal to the first delay time.

The read voltage generating circuit may perform a pumping operation in response to a pump clock signal that is generated based on the read enable signal and the trim code, and generate the read voltage.

The flash cell fuse circuit may include at least one flash cell fuse unit configured to generate each data bit of the trim code in response to the cell selection signal and the fuse word-line enable signal. The flash cell fuse unit may include a data memory configured to output first data in response to the fuse word-line enable signal; a fuse cell selector configured to generate second data in response to the cell selection signal, the second data corresponding to the first data; and a fuse cell sensor configured to latch the second data to generate a first bit of the trim code, the first bit of the trim code corresponding to the second data. The data memory may include a memory transistor configured to be enabled in response to the fuse word-line enable signal. The memory transistor may be a field effect transistor having a floating gate. The flash cell fuse unit may further include a driver configured to amplify an output signal of the fuse cell sensor to generate the first bit of the trim code.

The read voltage generating circuit may include a pumping circuit configured to perform a pumping operation in response to a pump clock signal to generate the read voltage and a regulator configured to stabilize the read voltage in response to the trim code to generate a feedback signal. The read voltage generating circuit may also include a pump control circuit configured to generate an oscillation enable signal in response to the feedback signal and the read enable signal, and an oscillator configured to generate the pump clock signal response to the oscillation enable signal.

The non-volatile semiconductor memory device may further include a column decoder configured to decode a column address signal and to provide the decoded column address signal to a column selection circuit. The column selection circuit provides selected data to the memory cell array in response to the decoded column address signal.

The memory cell array may also include a repair memory cell array configured to operate in response to the trim code when a fault is caused in the memory cell array.

According to other exemplary embodiments of the present invention, a flash cell fuse circuit includes a data memory, a fuse cell selector and a fuse cell sensor. The data memory is configured to output first data in response to a fuse word-line enable signal that is activated after a read enable signal by a first time. The fuse cell selector is configured to generate second data in response to a cell selection signal, the second data corresponding to the first data. The fuse cell sensor is configured to latch the second data and to generate a trim code corresponding to the second data.

The data memory may include a memory transistor configured to be activated in response to the fuse word-line enable signal. The memory transistor may be a field effect transistor having a floating gate. Also, the flash cell fuse circuit may include a driver configured to amplify an output signal of the fuse cell sensor to generate the trim code.

According to other exemplary embodiments of the present invention, a method of controlling a non-volatile semiconductor memory device includes generating a read enable signal and generating a fuse word-line enable signal after the read enable signal by a first delay time. A trim code is generated in response to the fuse word-line enable signal and a cell selection signal. A read voltage is generated in response to the read enable signal and the trim code.

The method may further include decoding the read voltage in response to a row address signal to generate a decoded read voltage. The decoded read voltage is provided to a memory cell array.

Generating the trim code may include outputting first data in response to the fuse word-line enable signal, and outputting second data in response to the cell selection signal, the second data corresponding to the first data. The second data is latched to generate a first bit of the trim code, the first bit of the trim code corresponding to the second data.

Generating the read voltage may include generating a pump clock signal in response to an oscillation enable signal and performing a pumping operation in response to the pump clock signal to generate the read voltage. The read voltage is stabilized in response to the trim code to generate a feedback signal. The oscillation enable signal is generated in response to the feedback signal and the read enable signal.

Generating the read enable signal may further include performing the pumping operation in response to the read enable signal when static electric charges are input through input/output pads. The pumping operation may be performed to reduce a voltage difference between a gate and a source of at least one fuse cell in a flash cell fuse circuit.

BRIEF DESCRIPTION OF THE DRAWINGS

The embodiments of the present invention will be described with reference to the attached drawings.

DESCRIPTION OF THE EMBODIMENTS

Figure 1:
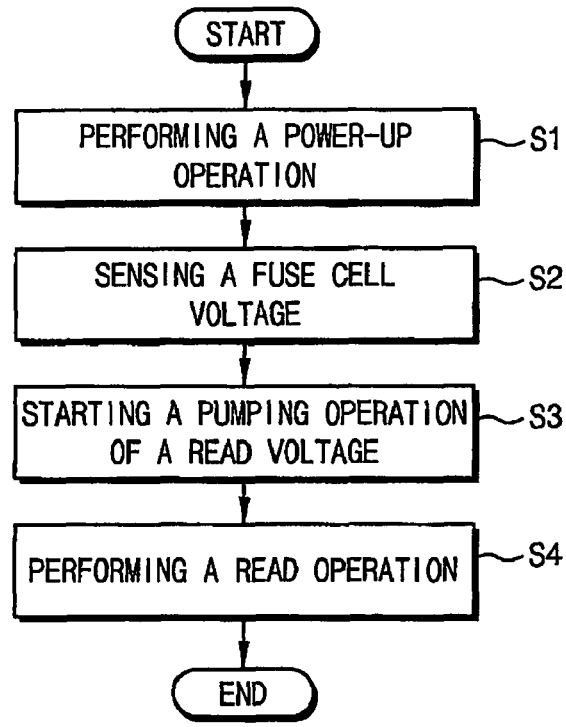
FIG. 1 is a flow chart illustrating an early stage of a read operation in a conventional flash memory device.
Figure 2:
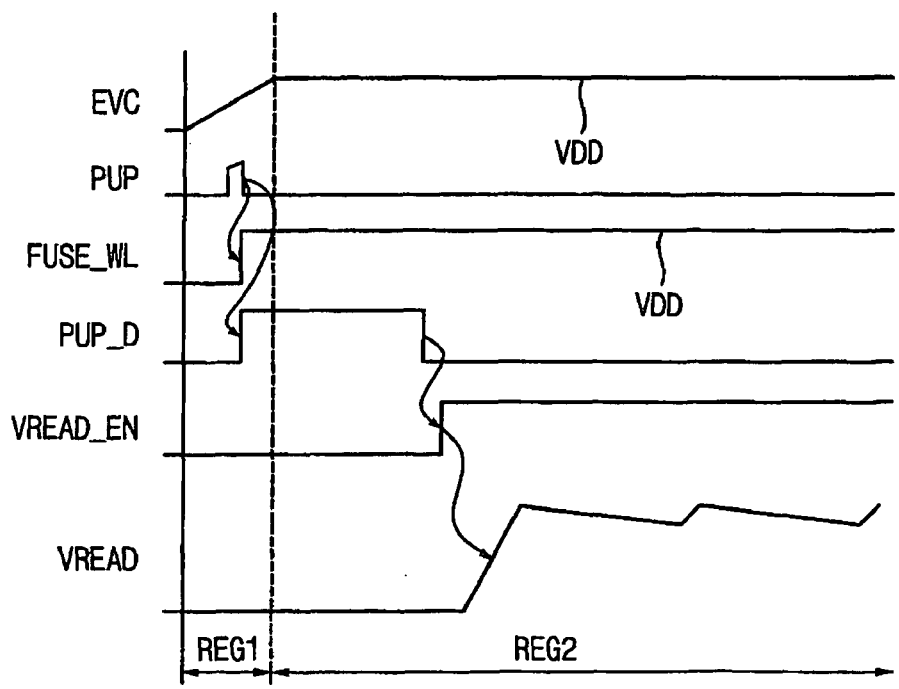
FIG. 2 is a timing diagram illustrating an early stage of a read operation in a conventional flash memory device.

Embodiments of the present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Like reference numerals will be used to refer to like or similar elements throughout the drawings and written description.

It will be understood that, although the terms first, second, etc., may be used herein to describe various elements, these elements should not be limited by these terms. These terms are used to distinguish one element from another. For example, a first element could be termed a second element, and similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments of the present invention provide a non-volatile semiconductor memory device capable of preventing fuse cells in a flash cell fuse circuit from being programmed by static electric charges when the static electric charges are input through input/output (I/O) pads. Also, exemplary embodiments of the present invention provide a method of controlling a non-volatile semiconductor memory device to prevent fuse cells in a flash cell fuse circuit from being programmed by static electric charges when the static electric charges are input through I/O pads.

Figure 3:
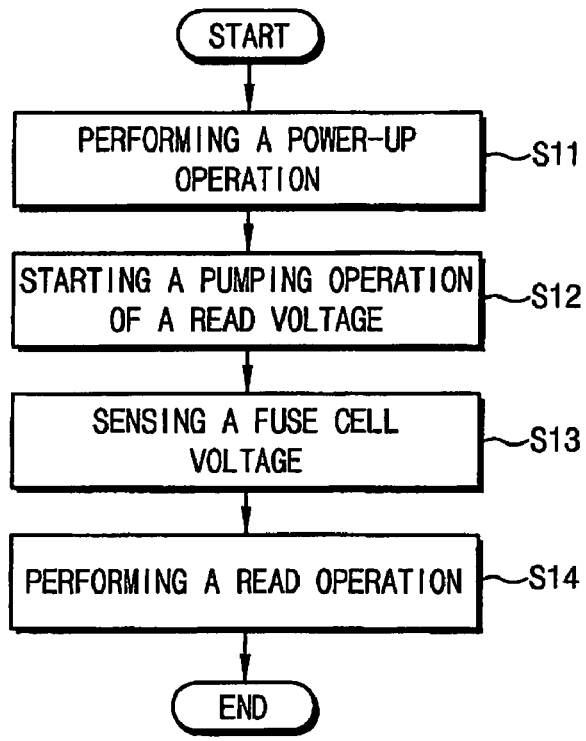
FIG. 3 is a flow chart illustrating an early stage of a read operation of a flash memory device, according to an exemplary embodiment of the present invention.

FIG. 3 is a flow chart illustrating an early stage of a read operation of a flash memory device, according to an exemplary embodiment of the present invention. Referring to FIG. 3, in the early stage of the read operation of the flash memory device, a power-up operation is performed (step S11), a pumping operation of a read voltage is started (step S12), a fuse cell voltage is sensed (step S13), and a read operation is performed (step S14).

Figure 4:
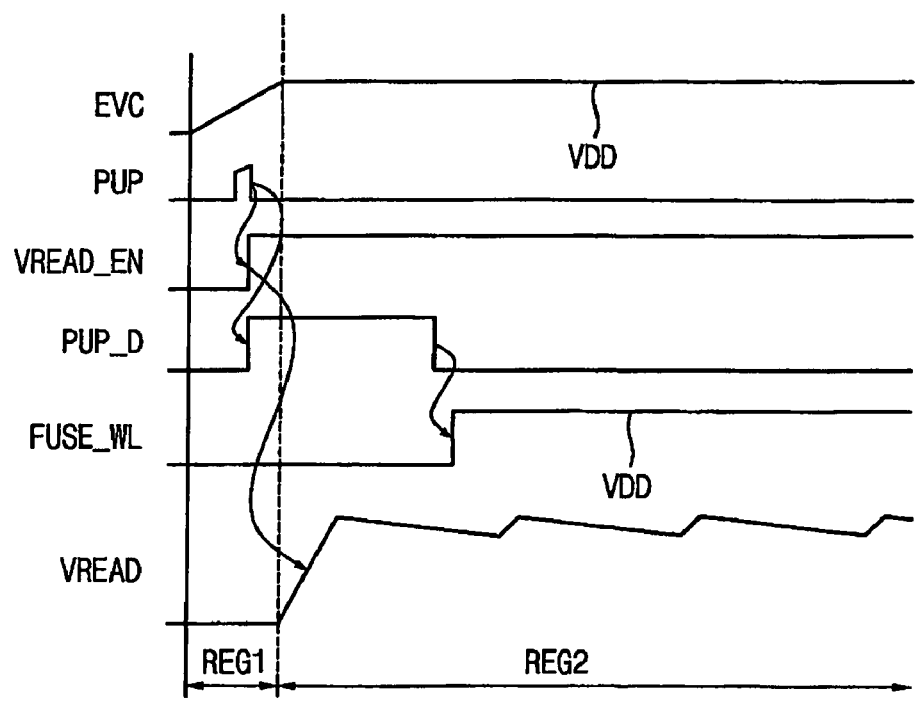
FIG. 4 is a timing diagram illustrating an early stage of a read operation of a flash memory device, according to an exemplary embodiment of the present invention.

FIG. 4 is a timing diagram illustrating an early stage of a read operation of a flash memory device according to an example embodiment of the present invention. Referring to FIG. 4, an external power supply voltage EVC increases to a power supply voltage VDD in a first time region REG1 where a power-up operation is performed. A power-up signal PUP is generated in the first time region REG1. In response to the power-up signal PUP, a read enable signal VREAD_EN is activated, and a delayed power-up signal PUP_D is generated. A fuse word-line enable signal FUSE_WL is activated in response to a falling edge of the delayed power-up signal PUP_D. A read voltage VREAD is generated in response to the read enable signal VREAD_EN. The stabilized power supply voltage is supplied in a second time region REG2. A voltage level of the fuse word-line enable signal FUSE_WL may be substantially equal to a voltage level of the power supply voltage VDD when the fuse word-line enable signal FUSE_WL is activated.

The flash memory device is mainly influenced in the first time region REG1 by static electric charges when the static electric charges are input into the flash memory device. The flash memory device controlled by the method described with reference to FIG. 3 and FIG. 4 generates a read voltage before sensing a fuse cell voltage. The fuse word-line enable signal FUSE_WL applied for sensing the fuse cell voltage is activated in the second time region REG2, where the power-up operation has been completed.

The flash memory device reduces a voltage between a gate and a source of memory transistors in the flash cell fuse circuit when the static electric charges are input into the flash memory device through I/O pads. Accordingly the flash memory device can prevent fuse cells in a flash cell fuse circuit from being programmed by the static electric charges.

Figure 5:
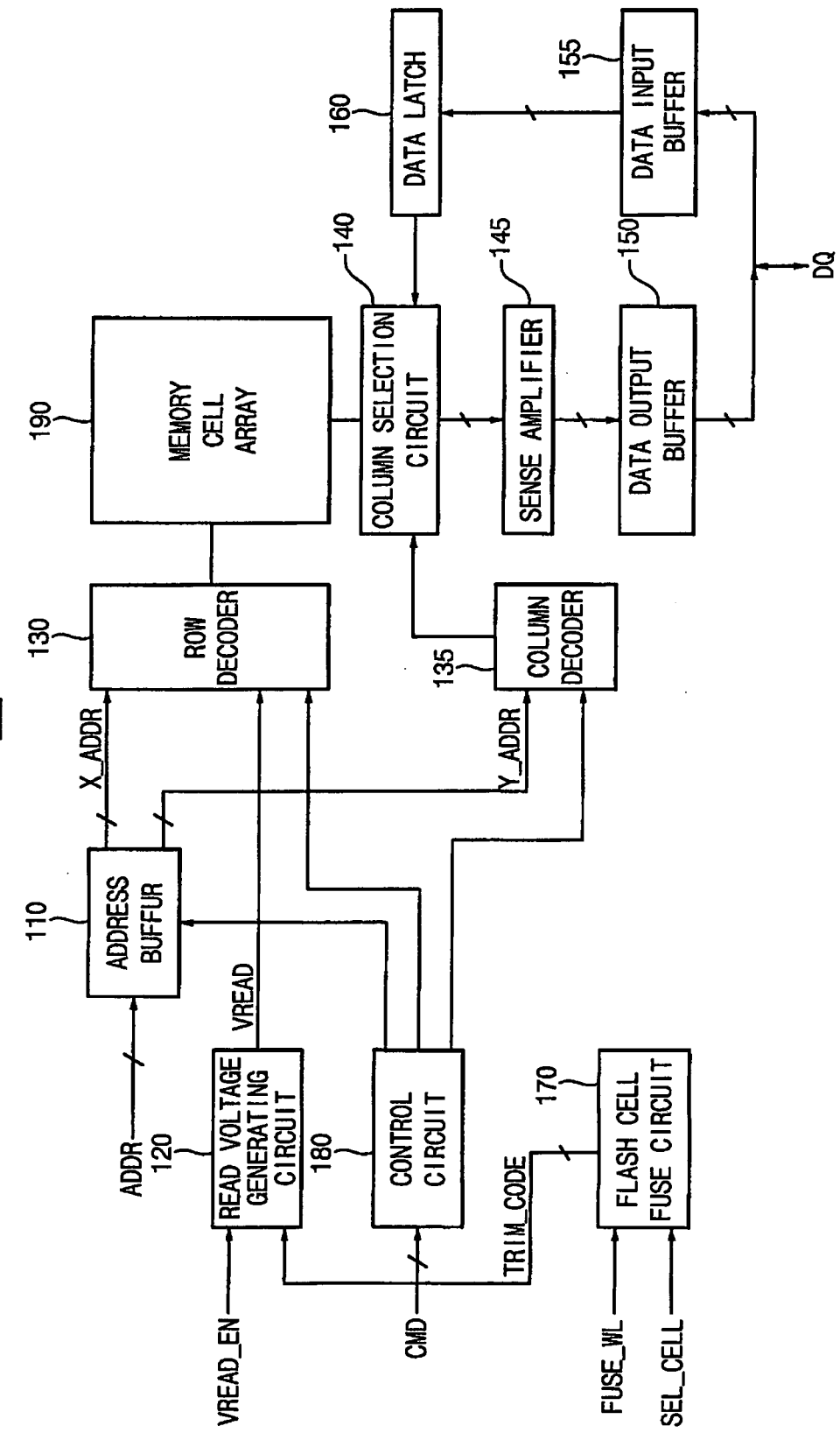
FIG. 5 is a block diagram illustrating a flash memory device, according to a first exemplary embodiment of the present invention.

FIG. 5 is a block diagram illustrating a flash memory device, according to a first exemplary embodiment of the present invention.

Referring to FIG. 5, the flash memory device 100 may include a read voltage generating circuit 120, a flash cell fuse circuit 170, a row decoder 130, and a memory cell array 190. The read voltage generating circuit 120 generates a read voltage VREAD in response to a read enable signal VREAD_EN and a trim code TRIM_CODE. The flash cell fuse circuit 170 generates the trim code TRIM_CODE in response to a cell selection signal SEL_CELL and a fuse word-line enable signal FUSE_WL that is activated during a time after the read enable signal VREAD_EN is activated. The row decoder 130 decodes the read voltage VREAD in response to a row address signal XADDR, and provides the decoded read voltage to the memory cell array 190.

In addition, the flash memory device 100 may further include an address buffer 110, a column decoder 135, a column selection circuit 140, and a sense amplifier 145. The address buffer 110 buffers an address signal ADDR, and generates the row address signal X_ADDR and a column address signal Y_ADDR. The column decoder 135 decodes the column address signal Y_ADDR, and generates the decoded column address signal. The column selection circuit 140 selects data received from outside in response to the decoded column address signal to provide the selected data to the memory cell array 190, and selects output data of the memory cell array 190 to output the selected output data to the sense amplifier 145. The sense amplifier 145 amplifies output data of the column selection circuit 140.

In addition, the flash memory device 100 may further include a control circuit 180, data output buffer 150, data input buffer 155, and data latch 160. The control circuit 180 generates control signals based on a command signal CMD, and provides the control signals to the address buffer 110, the row decoder 130, and the column decoder 135. The data output buffer 150 buffers output data of the sense amplifier 145, and provides the buffered output data to I/O pin DQ. The data input buffer 155 receives input data from the I/O pin DQ, and buffers the input data. The data latch 160 latches output data of the data input buffer 155, and provides the latched output data to the column selection circuit 140.

Figure 6:
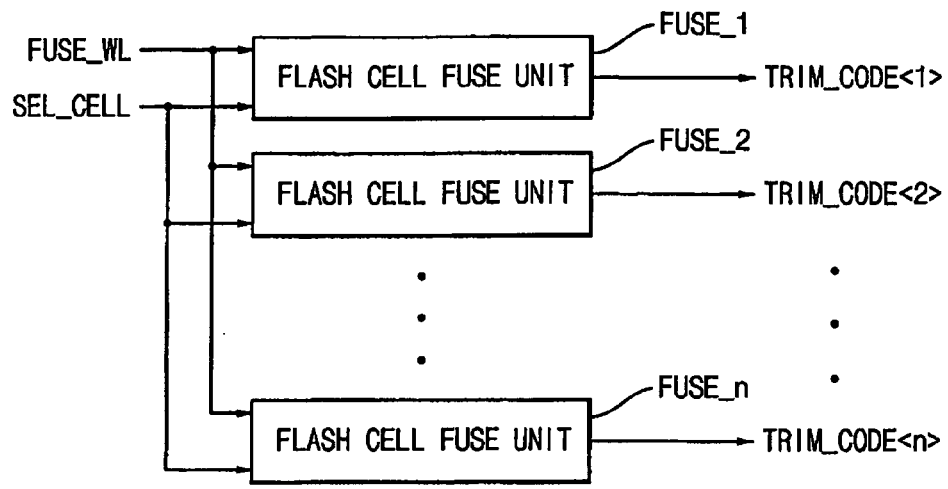
FIG. 6 is a block diagram illustrating a flash cell fuse circuit in the flash memory device of FIG. 5, according to an exemplary embodiment of the present invention.

FIG. 6 is a block diagram illustrating a flash cell fuse circuit in the flash memory device of FIG. 5, according to an exemplary embodiment of the present invention. Referring to FIG. 6, the flash cell fuse circuit 170 may include multiple flash cell fuse units FUSE_1 through FUSE_n that respectively generate data bits TRIM_CODE<1>through TRIM_CODE<n>of a trim code in response to a cell selection signal SEL_CELL and a fuse word-line enable signal FUSE_WL.

Figure 7:
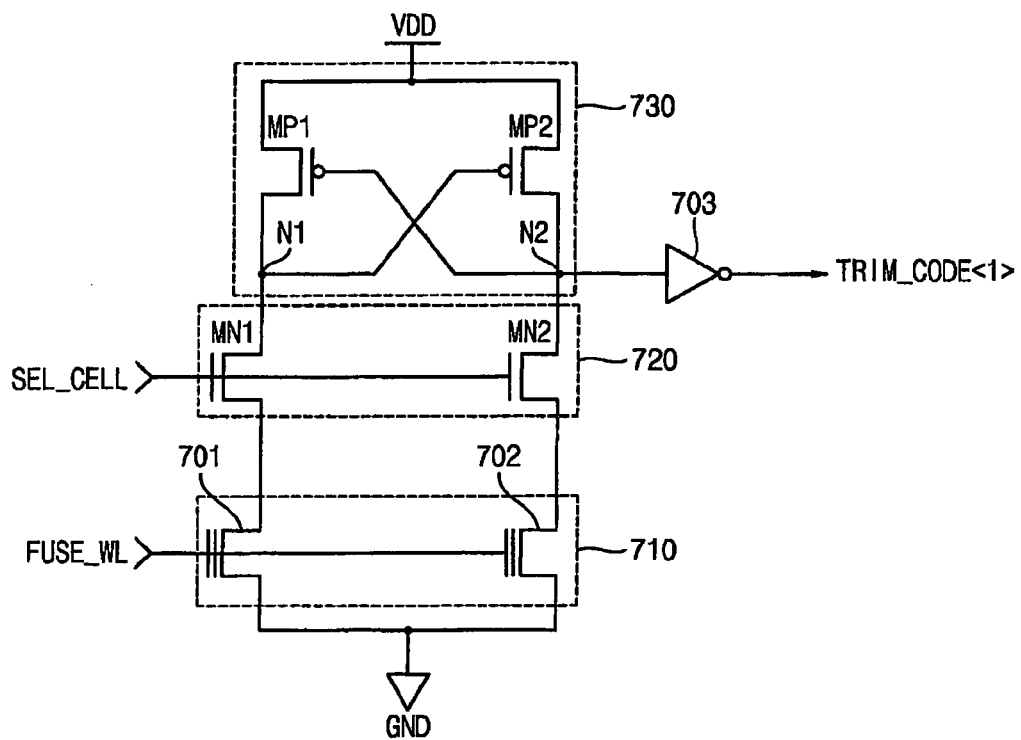
FIG. 7 is a circuit diagram illustrating a flash cell fuse unit in the flash cell fuse circuit of FIG. 6, according to an exemplary embodiment of the present invention.

FIG. 7 is a circuit diagram illustrating a flash fuse cell unit in the flash cell fuse circuit of FIG. 6, according to an exemplary embodiment of the present invention. Referring to FIG. 7, the first flash cell fuse unit FUSE_1 may include data memory unit 710, a fuse cell selection unit 720, a fuse cell sensor unit 730, and an inverter 703.

The data memory unit 710 outputs first data in response to a fuse word-line enable signal FUSE_WL that is activated during a time after a read enable signal VREAD_EN is activated. The fuse cell selection unit 720 outputs second data to a node N2 in response to a cell selection signal SEL_CELL, where the second data corresponds to the first data. The fuse cell sensor unit 730 latches the second data. The inverter 703 inverts a signal of the node N2, and generates a first bit TRIM_CODE<1>of a trim code. The inverter 703 may also act as a driver and amplify the signal of the node N2, so that the first bit TRIM_CODE<1>has a stabilized voltage level.

The data memory unit 710 includes a first memory transistor 701 and a second memory transistor 702. Each of the first memory transistor 701 and the second memory transistor 702 has a floating gate. The fuse cell selection unit 720 includes a first NMOS transistor MN1 and a second NMOS transistor MN2. The fuse cell sensor unit 730 includes a first PMOS transistor MP1 and a second PMOS transistor MP2 that are connected in a latch type.

Each of the first memory transistor 701 and the second memory transistor 702 has a source that is connected to a ground voltage GND and a gate that receives a fuse word-line enable signal FUSE_WL. The first NMOS transistor MN1 has a source that is connected to a drain of the first memory transistor 701, a gate that receives a cell selection signal SEL_CELL, and a drain that is connected to the node N1. The second NMOS transistor MN2 has a source that is connected to a drain of the second memory transistor 702, a gate that receives the cell selection signal SEL_CELL, and a drain that is connected to the node N2. The first PMOS transistor MP1 has a source that is connected to a power supply voltage VDD, a gate that is connected to the node N2, and a drain that is connected to the node N1. The second PMOS transistor MP2 has a source that is connected to the power supply voltage VDD, a gate that is connected to the node N1, and a drain that is connected to the node N2.

An exemplary operation of the first flash cell fuse unit FUSE_1 in FIG. 7 is as follows. Data stored in the data memory unit 710 is not output when the cell selection signal SEL_CELL is deactivated. The first NMOS transistor MN1 and the second NMOS transistor MN2 are turned on when the cell selection signal SEL_CELL is activated. The data stored in the data memory unit 710 is output when the fuse word-line enable signal FUSE_WL is activated. First data that is an output of the second memory transistor 702 is conveyed to the node N2 through the second NMOS transistor MN2. Second data that is a voltage of the node N2 is output through the inverter 703 as a first bit TRIM_CODE<1> of the trim code.

The first memory transistor 701 and the second memory transistor 702 operate in complementary fashion. The second memory transistor 702 is erased when the first memory transistor 701 is programmed. Likewise, the second memory transistor 702 is programmed when the first memory transistor 701 is erased. For example, when the second memory transistor 702 is programmed and the first memory transistor 701 is erased, the first memory transistor 701 is turned on and the second memory transistor 702 is turned off. The node N2 becomes logic 1 and the first bit TRIM_CODE<1> of the trim code is logic 0. When the second memory transistor 702 is erased and the first memory transistor 701 is programmed, the node N2 becomes logic 0 and the first bit TRIM_CODE<1> of the trim code is logic 1. When a voltage of the node N2 is logic 1, a voltage of the node N1 is logic 0.

Figure 8:
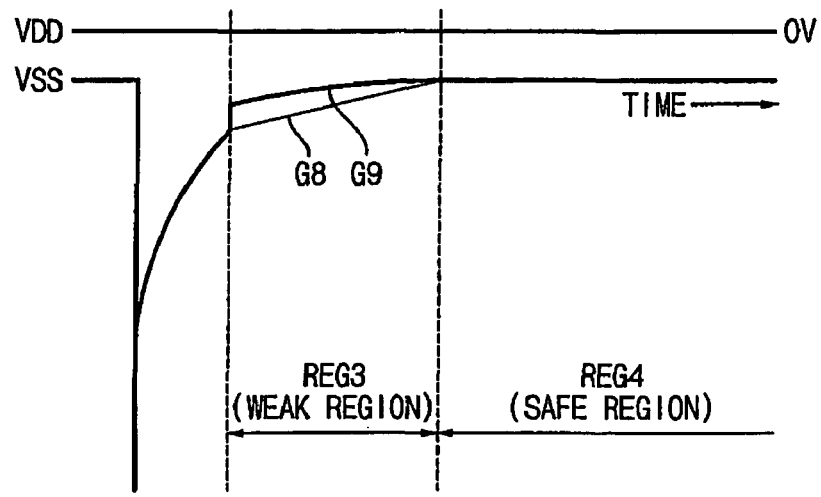
FIG. 8 is a waveform diagram illustrating a discharging test result of static electric charges, according to an exemplary embodiment of the present invention.

FIG. 8 is a waveform diagram illustrating a discharging test result of static electric charges, when 0V is applied to a power supply voltage node and a negative over-voltage corresponding to the static electric charges is applied to a low power supply voltage node (e.g., ground) in the flash memory device in FIG. 5.

Referring to FIG. 8, a low power supply voltage VSS of the low power supply voltage node falls abruptly to the negative over-voltage due to static electric charges. Whereas a flash cell fuse circuit 170 may be damaged by the static electric charges in a time region REG3, the flash cell fuse circuit 170 is safe from the static electric charges in a time region REG4. A voltage waveform G8 indicates the low power supply voltage VSS of the low power supply voltage node in a flash memory device controlled by the conventional method in FIG. 1, for example. In contrast, a voltage waveform G9 indicates the low power supply voltage VSS of the low power supply voltage node in a flash memory device controlled by the method in FIG. 3, according to an exemplary embodiment of the invention.

Figure 9:
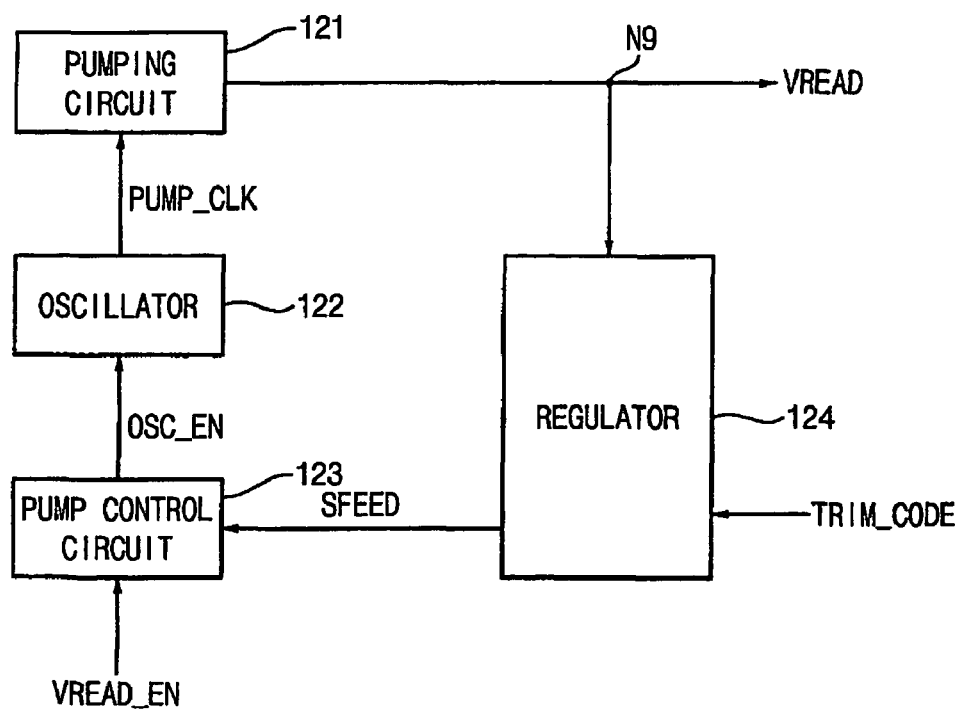
FIG. 9 is a block diagram illustrating a read voltage generating circuit in the flash memory device of FIG. 5, according to an exemplary embodiment of the present invention.

FIG. 9 is a block diagram illustrating a read voltage generating circuit in the flash memory device of FIG. 5, according to an exemplary embodiment of the present invention.

Referring to FIG. 9, the read voltage generating circuit 120 may include a pumping circuit 121, a regulator 124, a pump control circuit 123, and an oscillator 122.

The pumping circuit 121 performs a pumping operation in response to a pump clock signal PUMP_CLK to generate a read voltage VREAD, and outputs the read voltage VREAD to a node N9. The regulator 124 stabilizes the read voltage VREAD in response to a trim code TRIM_CODE, and generates a feedback signal SFEED. The pump control circuit 123 generates an oscillation enable signal OSC_EN in response to the feedback signal SFEED and a read enable signal VREAD_EN. The oscillator 122 generates the pump clock signal PUMP_CLK in response to the oscillation enable signal OSC_EN. The read enable signal VREAD_EN is activated before a fuse word-line enable signal FUSE_WL that is applied for sensing a fuse cell voltage. The read voltage generating circuit 120 generates the read voltage VREAD in response to the read enable signal VREAD_EN before the flash cell fuse circuit 170 performs a sensing operation.

Hereinafter, an operation of the flash memory device 100 will be described referring to FIG. 3 through FIG. 9.

Referring to FIG. 7, the fuse word-line enable signal FUSE_WL, which is applied to gates of the first memory transistor 701 and the second memory transistor 702 in the data memory unit 710, is substantially equal to the power supply voltage VDD, and may be input through the power supply voltage node. Sources of the first memory transistor 701 and the second memory transistor in the data memory unit 710 are connected to a low power supply voltage, e.g., the ground voltage node GND. Thus, when static electric charges having a positive over-voltage are input through the power supply voltage node or static electric charges having a negative over-voltage are input through the low power supply voltage node (e.g., the ground node GND), the first memory transistor 701 and the second memory transistor 702 could be programmed by the influence of the static electric charges.

The flash memory device 100 in FIG. 5 activates the read enable signal VREAD_EN before the fuse word-line enable signal FUSE_WL is activated for sensing the fuse cell voltage. The read voltage generating circuit 120 performs the pumping operation in response to the read enable signal VREAD_EN before the flash cell fuse circuit 170 performs a sensing operation. The read voltage generating circuit 120 generates the read voltage VREAD. Accordingly, a curve of a voltage waveform changes from the voltage waveform G8 to the voltage waveform G9 in a time region REG3, as shown in FIG. 8, for example, by the pumping operation of the read voltage generating circuit 120. Thus, a voltage difference between the gate and the source of the first memory transistor 701 and the second memory transistor 702 is reduced. As a result of the voltage difference reduction, the flash memory device 100 can prevent the fuse cells in the flash cell fuse circuit 170 from being programmed by the static electric charges.

Figure 10:
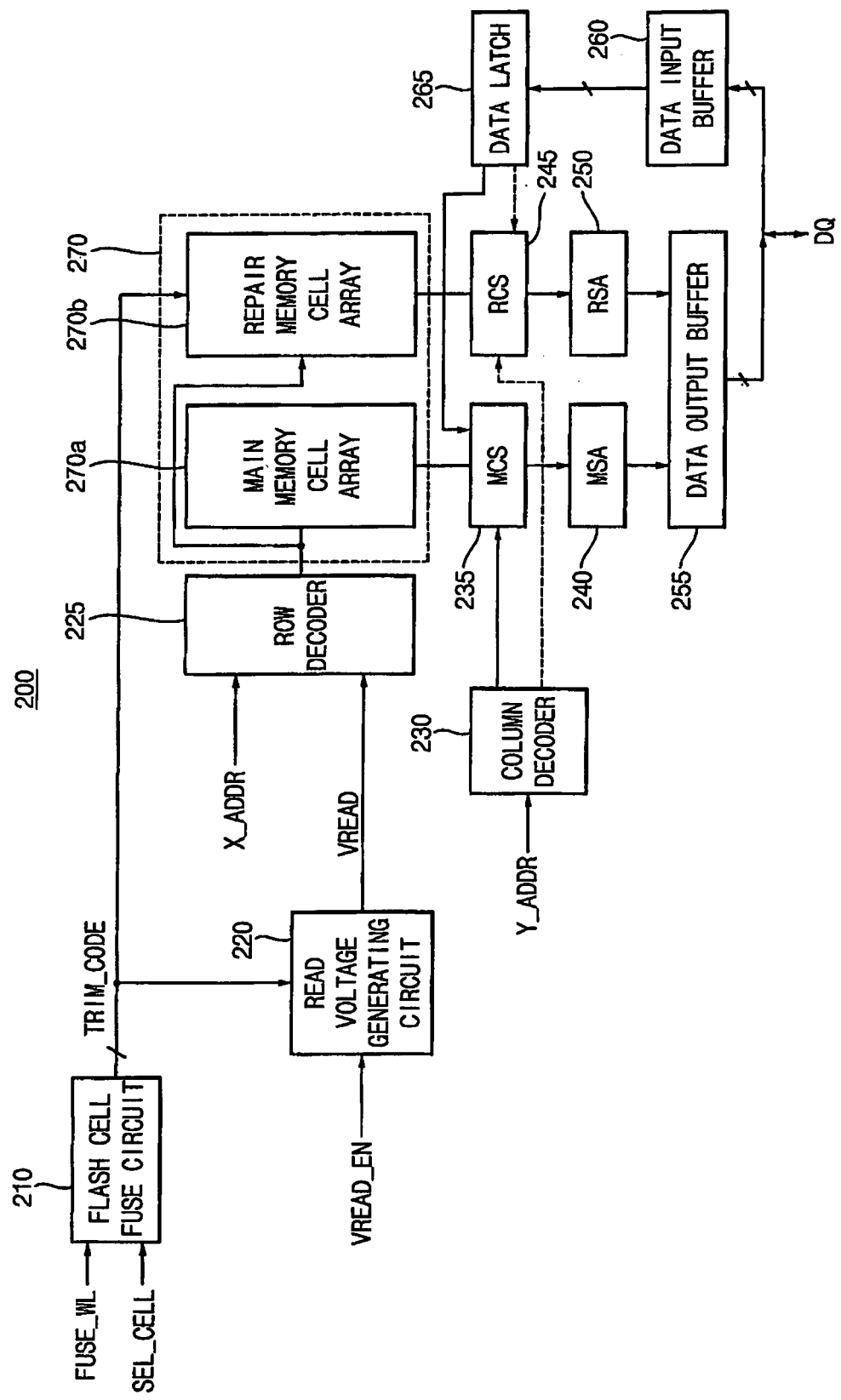
FIG. 10 is a block diagram illustrating a flash memory device according to an exemplary embodiment of the present invention.

FIG. 10 is a block diagram illustrating a flash memory device, according to another exemplary embodiment of the present invention.

Referring to FIG. 10, the flash memory device 200 may include a read voltage generating circuit 220, a flash cell fuse circuit 210, a row decoder 225, and a memory cell array 270. The memory cell array 270 may include a main memory cell array 270a and a repair memory cell array 270b. The repair memory cell array 270b may include redundancy cells.

The read voltage generating circuit 220 generates a read voltage VREAD in response to a read enable signal VREAD_EN and a trim code TRIM_CODE. The flash cell fuse circuit 210 generates the trim code TRIM_CODE in response to a cell selection signal SEL_CELL and a fuse word-line enable signal FUSE_WL that is activated after the read enable signal VREAD_EN by a time period. The row decoder 225 decodes the read voltage VREAD in response to a row address signal X_ADDR, and provides the decoded read voltage to the memory cell array 270.

In addition, the flash memory device 200 may further include a column decoder 230, a main column selection circuit 235, a main sense amplifier 240, a repair column selection circuit 245, a repair sense amplifier 250, and data output buffer 255.

The column decoder 230 decodes a column address signal Y_ADDR, and generates a decoded column address signal. The main column selection circuit 235 selects data received from outside in response to the decoded column address signal to provide the selected data to the main memory cell array 270a, and selects output data of the main memory cell array 270a to output the selected output data to the main sense amplifier 240. The main sense amplifier 240 amplifies the output data of the main column selection circuit 235. The repair column selection circuit 245 selects data received from outside in response to the decoded column address signal to provide the selected data to the repair memory cell array 270b, and selects output data of the repair memory cell array 270b to provide the selected output data to the repair sense amplifier 250. The repair sense amplifier 250 amplifies the output data of the repair column selection circuit 245. The data output buffer 255 buffers an output signal of the main sense amplifier 240 and an output signal of the repair sense amplifier 250 to provide the buffered output signals to I/O pin DQ.

In addition, the flash memory device 200 may further include data input buffer 260 and data latch 265. The data input buffer 260 receives input data through the I/O pin DQ, and buffers the received input data. The data latch 265 latches output data of the data input buffer 260 to provide the latched output data to the main column selection circuit 235 and the repair column selection circuit 245.

Hereinafter, an operation of the flash memory device 200 of FIG. 10 will be described. The flash cell fuse circuit 210 in FIG. 10 may have the same structure as the flash cell fuse circuit 170 in FIG. 5. The read voltage generating circuit 220 in FIG. 10 may have the same structure as the read voltage generating circuit 120 in FIG. 5. The flash memory device 200 of FIG. 10 may also include have the address buffer 110 and the control circuit 180 in FIG. 5, although the address buffer 110 and the control circuit 180 are not pictured in FIG. 10, for convenience.

The flash memory device 200 of FIG. 10 includes the repair memory cell array 270b. A part of the repair memory cell array 270b is activated instead of a fault part of the main memory cell array 270a in response to a trim code TRIM_CODE in response to the fault part of the main memory cell array 270a.

The flash memory device 200 activates a read enable signal VREAD_EN before a fuse word-line enable signal FUSE_WL, which is applied for sensing a fuse cell voltage as the flash memory device 100 of FIG. 5. The read voltage generating circuit 220 performs a pumping operation in response to the read enable signal VREAD_EN before the flash cell fuse circuit 210 performs a sensing operation, and the read voltage generating circuit 220 generates a read voltage VREAD. Referring to FIG. 8, for example, a curve of waveform is changed from a waveform G8 to a waveform G9 in a time region REG3. Thus, a voltage difference between a gate and a source of memory transistors in the flash cell fuse circuit 210 is reduced. As a result of the voltage difference reduction, the flash memory device 200 can prevent the fuse cells in the flash cell fuse circuit 270 from being programmed by the static electric charges.

Although a flash memory device capable of preventing fuse cells in a flash cell fuse circuit from being programmed by the static electric charges is described, the present invention may be applied to overall semiconductor memory devices using a trim code.

In accordance with exemplary embodiments of the present invention, a non-volatile semiconductor memory device activates a read enable signal before a fuse word-line enable signal, which is applied for sensing a fuse cell voltage. A pumping operation is performed in response to the read enable signal before the flash cell fuse circuit performs a sensing operation. The non-volatile semiconductor memory device therefore reduces a voltage difference between a gate and a source of fuse cells in an early stage of a read operation of the non-volatile semiconductor memory device when static electric charges are input through I/O pads. In addition, the non-volatile semiconductor memory device activates the fuse word-line enable signal in a safe region where a power-up operation has been finished. Accordingly, the non-volatile semiconductor memory device prevents fuse cells in the flash cell fuse circuit from being programmed by the static electric charges.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A non-volatile semiconductor memory device, comprising:
a read voltage generating circuit configured to generate a read voltage in response to a read enable signal and a trim code;
a flash cell fuse circuit configured to generate the trim code in response to a cell selection signal and a fuse word-line enable signal, the fuse word-line enable signal being activated after the read enable signal by a first delay time; and
a row decoder configured to decode the read voltage in response to a row address signal to generate a decoded read voltage, and to provide the decoded read voltage to a memory cell array.

2. The non-volatile semiconductor memory device of claim 1, wherein the read voltage generating circuit performs a pumping operation in response to the read enable signal to reduce a voltage difference between a gate and a source of each cell in the flash cell fuse circuit when static electric charges are received through input/output (I/O) pads.

3. The non-volatile semiconductor memory device of claim 1, wherein a voltage level of the fuse word-line enable signal is substantially equal to a power supply voltage level, and the read voltage level is higher than the power supply voltage level.

4. The non-volatile semiconductor memory device of claim 1, wherein the read enable signal is activated in response to a power-up signal, and the fuse word-line enable signal is activated in response to a delayed power-up signal that is delayed by a second delay time with respect to the power-up signal.

5. The non-volatile semiconductor memory device of claim 4, wherein the second delay time is substantially equal to the first delay time.

6. The non-volatile semiconductor memory device of claim 1, wherein the read voltage generating circuit performs a pumping operation in response to a pump clock signal that is generated based on the read enable signal and the trim code, and generates the read voltage.

7. The non-volatile semiconductor memory device of claim 1, wherein the flash cell fuse circuit comprises:
at least one flash cell fuse unit configured to generate each data bit of the trim code in response to the cell selection signal and the fuse word-line enable signal.

8. The non-volatile semiconductor memory device of claim 7, wherein the flash cell fuse unit comprises:
a data memory configured to output first data in response to the fuse word-line enable signal;
a fuse cell selector configured to generate second data in response to the cell selection signal, the second data corresponding to the first data; and
a fuse cell sensor configured to latch the second data to generate a first bit of the trim code, the first bit of the trim code corresponding to the second data.

9. The non-volatile semiconductor memory device of claim 8, wherein the data memory comprises:
a memory transistor configured to be enabled in response to the fuse word-line enable signal.

10. The non-volatile semiconductor memory device of claim 9, wherein the memory transistor comprises:
a field effect transistor having a floating gate.

11. The non-volatile semiconductor memory device of claim 8, wherein the flash cell fuse unit further comprises:
a driver configured to amplify an output signal of the fuse cell sensor to generate the first bit of the trim code.

12. The non-volatile semiconductor memory device of claim 1, wherein the read voltage generating circuit comprises:
a pumping circuit configured to perform a pumping operation in response to a pump clock signal to generate the read voltage;
a regulator configured to stabilize the read voltage in response to the trim code to generate a feedback signal;
a pump control circuit configured to generate an oscillation enable signal in response to the feedback signal and the read enable signal; and
an oscillator configured to generate the pump clock signal response to the oscillation enable signal.

13. The non-volatile semiconductor memory device of claim 1, further comprising:
a column decoder configured to decode a column address signal and to provide the decoded column address signal to a column selection circuit, which provides selected data to the memory cell array in response to the decoded column address signal.

14. The non-volatile semiconductor memory device of claim 1, wherein the memory cell array comprises:
a repair memory cell array configured to operate in response to the trim code when a fault is caused in the memory cell array.

15. A flash cell fuse circuit, comprising:
a data memory configured to output first data in response to a fuse word-line enable signal that is activated after a read enable signal by a first time;
a fuse cell selector configured to generate second data in response to a cell selection signal, the second data corresponding to the first data; and
a fuse cell sensor configured to latch the second data and to generate a trim code corresponding to the second data.

16. The flash cell fuse circuit of claim 15, wherein the data memory comprises:
a memory transistor configured to be activated in response to the fuse word-line enable signal.

17. The flash cell fuse circuit of claim 16, wherein the memory transistor comprises:
a field effect transistor having a floating gate.

18. The flash cell fuse circuit of claim 15, further comprising:
a driver configured to amplify an output signal of the fuse cell sensor to generate the trim code.

19. A method of controlling a non-volatile semiconductor memory device, comprising:
generating a read enable signal;
generating a fuse word-line enable signal after the read enable signal by a first delay time;
generating a trim code in response to the fuse word-line enable signal and a cell selection signal; and
generating a read voltage in response to the read enable signal and the trim code.

20. The method of claim 19, further comprising:
decoding the read voltage in response to a row address signal to generate a decoded read voltage; and
providing the decoded read voltage to a memory cell array.

21. The method of claim 19, wherein generating the trim code comprises:
outputting first data in response to the fuse word-line enable signal;
outputting second data in response to the cell selection signal, the second data corresponding to the first data; and
latching the second data to generate a first bit of the trim code, the first bit of the trim code corresponding to the second data.

22. The method of claim 19, wherein generating the read voltage comprises:
generating a pump clock signal in response to an oscillation enable signal;
performing a pumping operation in response to the pump clock signal to generate the read voltage;
stabilizing the read voltage in response to the trim code to generate a feedback signal; and
generating the oscillation enable signal in response to the feedback signal and the read enable signal.

23. The method of claim 19, wherein generating the read enable signal further comprises:
performing the pumping operation in response to the read enable signal when static electric charges are input through input/output pads.

24. The method of claim 23, wherein the pumping operation is performed to reduce a voltage difference between a gate and a source of at least one fuse cell in a flash cell fuse circuit.

* * * * *